(12) United States Patent
Tan et al.

(10) Patent No.: US 7,880,381 B2
(45) Date of Patent: Feb. 1, 2011

(54) LED WITH LIGHT ABSORBING ENCAPSULANT AND RELATED METHODOLOGY

(75) Inventors: Kheng Leng Tan, Penang (MY); Janet Bee Yin Chua, Perak (MY); Wei Liam Loo, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 621 days.

(21) Appl. No.: 11/481,088

(22) Filed: Jul. 5, 2006

(65) Prior Publication Data

US 2008/0007172 A1 Jan. 10, 2008

(51) Int. Cl.
*H05B 33/00* (2006.01)
(52) U.S. Cl. .................................. 313/512
(58) Field of Classification Search ............. 313/512, 313/498
See application file for complete search history.

(56) References Cited

U.S. PATENT DOCUMENTS

| | | | | |
|---|---|---|---|---|
| 4,388,566 A * | 6/1983 | Bedard et al. | ............... | 315/291 |
| 6,204,545 B1 * | 3/2001 | Nakata | ........................ | 257/459 |
| 6,234,648 B1 * | 5/2001 | Borner et al. | ............... | 362/235 |
| 6,357,889 B1 * | 3/2002 | Duggal et al. | ................. | 362/84 |
| 6,577,073 B2 * | 6/2003 | Shimizu et al. | ............. | 315/246 |
| 6,836,260 B2 * | 12/2004 | Cok | ............................ | 345/45 |
| 6,891,203 B2 * | 5/2005 | Kozawa et al. | .............. | 257/102 |
| 2004/0227465 A1 * | 11/2004 | Menkara et al. | ............. | 313/585 |

FOREIGN PATENT DOCUMENTS

JP          2004088008 A   *   3/2004

* cited by examiner

*Primary Examiner*—Toan Ton
*Assistant Examiner*—Hana S Featherly

(57) ABSTRACT

A plurality of different frequency absorbing materials are placed between an LED and a surface so as to generate a non-monochromatic colors. In one embodiment, a light device is arranged with light sources, each of which emit light of a different color, and by surrounding the different colored light sources with a color changing media, each of which absorb light of different colors and by allowing the light sources to be individually calibrated as to power level, a variety of colors can be achieved.

4 Claims, 2 Drawing Sheets

LED WITH LIGHT ABSORBING ENCAPSULANT AND RELATED METHODOLOGY

TECHNICAL FIELD

This invention relates to light sources and more particularly to light sources that can selectively change color across a broad spectrum.

BACKGROUND OF THE INVENTION

There are presently many uses for light sources that can change color. One popular light source is constructed from light emitting diodes (LEDs). One problem is that each LED can only emit light of a single color and usually these colors are monochromatic. Today, these colors are red, green, blue or amber. A multicolor light source could be built with combinations of LED chips (red, blue, green, amber) and then by selectively activating the chips, one of the colors could be achieved. Colors other than the individual chip color could be obtained by activating two or more different color chips at one time. This, however, will result in poor (uneven) color mixing.

Additional colors can be achieved by surrounding each LED chip with a color changing medium. For example, by using yellow phosphorus with a blue LED, the color white can be achieved. Phosphors are selected based upon their absorption and emission characteristics. Using this arrangement, a larger number of colors can be achieved, all of which fall on the border of the CIE diagram since they are all saturated colors. Saturated colors are normally produced by the diodes which emit a certain color or wavelength. If this color is not absorbed by the phosphor, a saturated color (generally) will result. Saturated colors can also be produced using the phosphor loading (max) depending on the color desired.

BRIEF SUMMARY OF THE INVENTION

A plurality of different frequency absorbing materials are placed between an LED and a surface so as to generate non-monochromatic colors. In one embodiment, a light device is arranged with light sources, each of which emit light of a different color, and by surrounding the different colored light sources with a color changing media, each of which absorb light of different colors and by allowing the light sources to be individually calibrated as to power level, a variety of colors can be achieved.

DETAILED DESCRIPTION OF THE INVENTION

Figure 1:
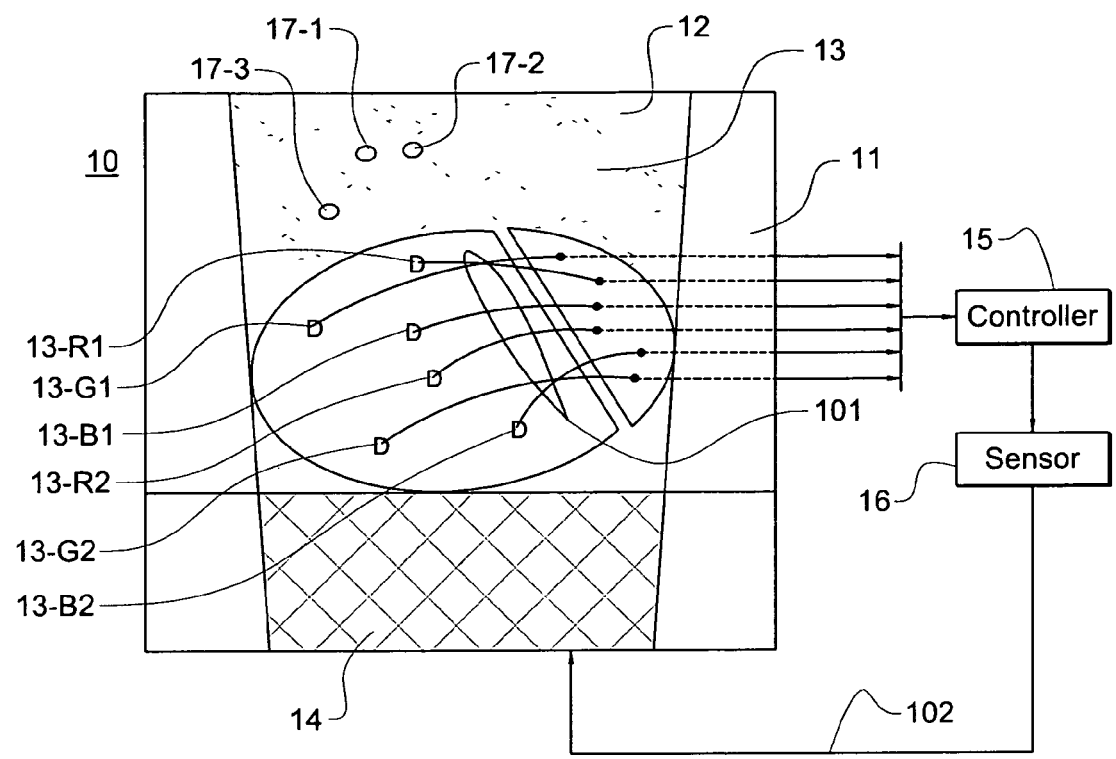
FIG. 1 shows a multicolored light device having multiple LED chips.

FIG. 1 shows device 10 having housing 11 with substrate 14. Within cavity 12 of housing 11, there resides a plurality of different colored LED chips, for example, chips 13-R1, 13-G1, 13-B1, 13-R2, 13-G2, and 13-B2. Some of these chips could be red (R), some green (G) or some blue (B) or they could be any other available colored chip. Note that while only two chips of each color (R, G, B) are shown, any combination of chips and any number of chips can be utilized.

Each of the chips is connected by bond wires 101 to controller 15. Controller 15, in conjunction with sensor 16, controls power to the various LED chips via wires 102. Sensor 16 measures, for example, the frequency of the light output and/or the intensity of the light and causes controller 15 to add or remove power or to modify other parameters, such as frequency.

Figure 3:
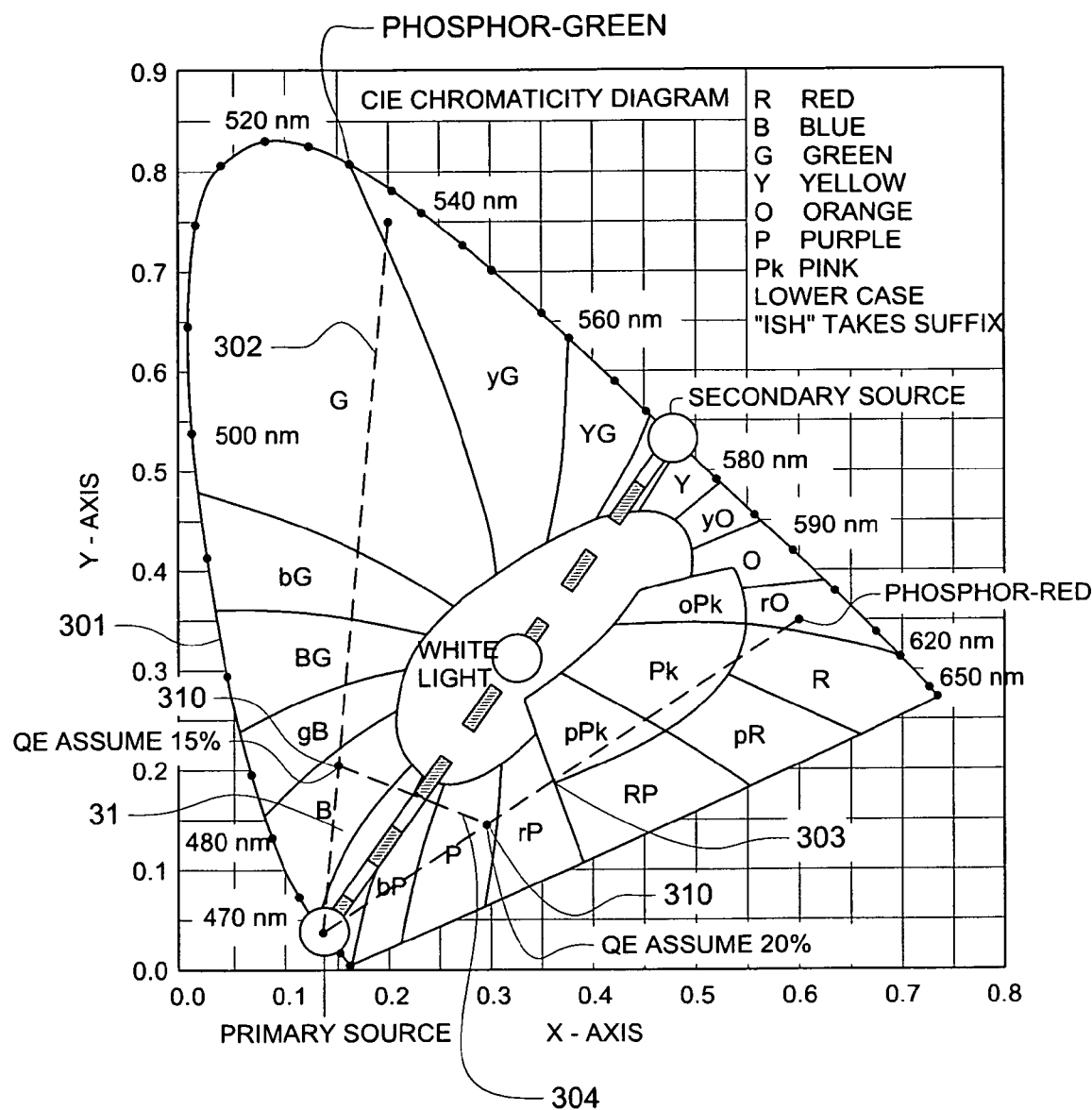
FIG. 3 shows a CIE diagram.

Cavity 12 has contained therein incapsulant material 13 containing different colored phosphors, such as phosphors 17-1, 17-2, and 17-3. Some phosphors absorb certain colors and do not absorb other colors. The colors that are not absorbed are emitted as saturated colors. Some of the phosphors can convert the light to a different color, and these converted colors can mix with the saturated colors to obtain colors from within the CIE diagram as shown in FIG. 3 in the manner to be discussed hereinafter. The intensity of each LED can, if desired, be tuned by the controller so that the intensity of different colors or mixtures of colors can be tuned. Substrate 14 can be connected to a heatsink (not shown) to conduct heat away from the dies, if desired.

Figure 2:
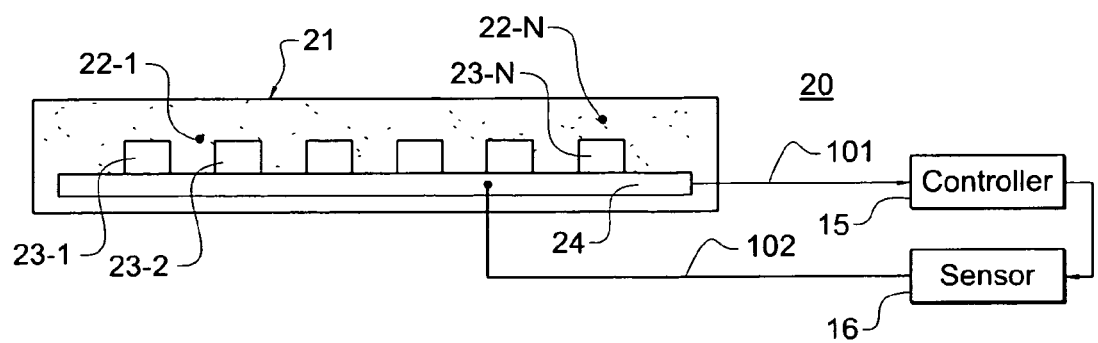
FIG. 2 shows one embodiment of a control circuit for analyzing the circuit of FIG. 1 in a panel arrangement.

FIG. 2 shows one embodiment of an arrangement for enabling the system of FIG. 1 in a panel arrangement. As shown, panel 20 includes substrate 24 having mounted thereon LED chips 23-1 to 23-N. These chips can be any combination of colors desired as discussed above operable under control of controller 15 and sensor 16 to achieve different colors, depending upon the intensity of the LED as compared to the different phosphors 22-1 to 22-N surrounding the LED chips. While FIGS. 1 and 2 illustrate only a few instances of phosphor, this phosphor can be as dense as is necessary to produce the colors desired.

FIG. 3 illustrates a CIE chart showing different colors. Monochromatic colors are at the circumference of the chart (line 301) with white shown at the center. The letters on the chart show the blended colors. Thus G is green, B is blue and BG represents blue and green while gB is less green than blue.

The output color that a user would observe can be selected using the CIE chart of FIG. 3, for example, by selecting a diode color, and a plurality of phosphors to surround the selected diode. Each if the selected phosphors can then be weighted by efficiency and by absorption. For ease of discussion we can call that weighting a QE and express it as a percentage of phosphor.

By way of example, assume that an output color is desired that would fall within area 31 (the triangular area formed within broken lines 302, 303, 304). Using such an assumption, a UV blue diode in the range of perhaps 460 nm can be selected. Such a diode would fall at the cross of X coordinate 0.15 and Y coordinate 0.05 (0.15, 0.05).

A green phosphor could be selected that would fall at coordinate point 0.2, 7.5. By selecting a 15% QE for the selected phosphor, point 310 is known. Note that point 310 is an assumed point for purposes of this discussion. A red phosphor is also selected that falls at coordinate point 0.6, 3.5. Assume then that the 20% point falls at point 311. The triangle that is formed between line 302 (which connects the selected diode with the green selected phosphor) and line 303 (which connects the selected diode with the red selected phosphor and line 304 that connects the two phosphor percentage points now bounds the color that will be observed when the blue diode impacts the selected phosphors that are held in the encapsulate material as discussed with respect to FIGS. 1 and 2. This then provides blended colors that are not otherwise attainable. By changing the power to the selected diode the resultant output color can change.

More than two phosphors can be selected using the scheme discussed herein. Also, more than one diode can be used and by selectively activating different LED chips, and by selectively changing LED chip power level in proximity to different phosphors, a user can select the ultimate color(s) of the device or display. Using this arrangement a full spectrum of colors can be achieved, both on the border of the CIE chart as well as in the center region.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A light source comprising:
   a plurality of LED chips, each of said plurality of LED chips being operable to emit light of a different frequency;
   an encapsulant material encapsulating said plurality of LED chips, said encapsulant material comprising at least two different phosphors, each of said at least two different phosphors having selected absorption characteristics matched to the color of a desired output light of said light source;
   a sensor capable of measuring the frequency of actual output light from said light source;
   a controller capable of adjusting said frequency of actual output light by individually controlling the amount of power supplied to each of said plurality of LED chips in response to the frequency of actual output light sensed by said sensor.

2. The light source of claim 1 and further wherein:
   the color of the actual output light of said light source is selectively controlled by changing the loading factor of said at least two phosphors to obtain a particular desired color.

3. The light source of claim 2, wherein the desired color is non-monochromatic and non-white.

4. The light source of claim 1, wherein the at least two different phosphors are selected from the list of: $CaS:Eu^{2+},Mn^{2+}$; $SrS:Eu^{2+}$; $(Zn,Cd)S:Ag$; $Mg_4GeO_5.5F:Mn^{4+}$; $CaS:Ce^{3+}$; $ZnS:Cu^+$; $SrGa_2S_4:Eu^{2+}$; and $YAG:Ce^{3+}$.

* * * * *